(12) United States Patent
Iucolano

(10) Patent No.: US 11,538,922 B2
(45) Date of Patent: Dec. 27, 2022

(54) MANUFACTURING METHOD OF AN HEMT TRANSISTOR OF THE NORMALLY OFF TYPE WITH REDUCED RESISTANCE IN THE ON STATE AND HEMT TRANSISTOR

(71) Applicant: STMICROELECTRONICS S.r.l., Agrate Brianza (IT)

(72) Inventor: Ferdinando Iucolano, Gravina di Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/118,439

(22) Filed: Dec. 10, 2020

(65) Prior Publication Data

US 2021/0091205 A1    Mar. 25, 2021

Related U.S. Application Data

(62) Division of application No. 16/254,322, filed on Jan. 22, 2019, now Pat. No. 10,896,969.

(30) Foreign Application Priority Data

Jan. 23, 2018    (IT) .......................... 102018000001693

(51) Int. Cl.
*H01L 29/66*    (2006.01)
*H01L 29/10*    (2006.01)
(Continued)

(52) U.S. Cl.
CPC .... *H01L 29/66462* (2013.01); *H01L 21/2258* (2013.01); *H01L 21/3245* (2013.01);
(Continued)

(58) Field of Classification Search
CPC ......... H01L 29/06; H01L 29/10; H01L 29/20; H01L 29/43; H01L 29/66; H01L 29/432;
(Continued)

(56) References Cited

U.S. PATENT DOCUMENTS 5,073,895 A    12/1991    Omura
9,666,677 B1 *   5/2017    Raring ................ H01L 21/6835
(Continued)

FOREIGN PATENT DOCUMENTS

CN    103035672 A    4/2013
CN    103367419 A    10/2013
CN    103367425 A    10/2013

OTHER PUBLICATIONS

Hilt et al., "Normally-off AlGaN/GaN HFET with p-type GaN Gate and AlGaN Buffer," *Proceedings of the 22nd International Symposium on Power Semiconductor Devised & IC's*, Jun. 6-10, 2010, Hiroshima, Japan, pp. 347-350.
(Continued)

*Primary Examiner* — Chuong A Luu
(74) *Attorney, Agent, or Firm* — Seed Intellectual Property Law Group LLP

(57) ABSTRACT

A manufacturing method of an HEMT includes: forming a heterostructure; forming a first gate layer of intrinsic semiconductor material on the heterostructure; forming a second gate layer, containing dopant impurities of a P type, on the first gate layer; removing first portions of the second gate layer so that second portions, not removed, of the second gate layer form a doped gate region; and carrying out a thermal annealing of the doped gate region so as to cause a diffusion of said dopant impurities of the P type in the first gate layer and in the heterostructure, with a concentration, in the heterostructure, that decreases as the lateral distance from the doped gate region increases.

18 Claims, 4 Drawing Sheets

(51) Int. Cl.
  *H01L 29/778* (2006.01)
  *H01L 21/324* (2006.01)
  *H01L 21/225* (2006.01)
  *H01L 29/20* (2006.01)

(52) U.S. Cl.
  CPC ...... *H01L 29/1066* (2013.01); *H01L 29/2003* (2013.01); *H01L 29/778* (2013.01); *H01L 29/7786* (2013.01)

(58) Field of Classification Search
  CPC ............... H01L 29/778; H01L 29/1066; H01L 29/0688; H01L 29/2003; H01L 29/7786; H01L 29/66431; H01L 29/66462; H01L 29/7782; H01L 29/40; H01L 29/417; H01L 29/1075; H01L 29/1083; H01L 29/1087; H01L 21/205; H01L 21/225; H01L 21/324; H01L 21/2258; H01L 21/3245
  USPC ........................................................ 257/194
  See application file for complete search history.

(56) References Cited

U.S. PATENT DOCUMENTS

| | | |
|---|---|---|
| 2009/0212325 A1 | 8/2009 | Sato |
| 2012/0129301 A1 | 5/2012 | Or-Bach et al. |
| 2013/0256684 A1 | 10/2013 | Nishimori et al. |
| 2014/0264441 A1 | 9/2014 | Murase |
| 2017/0278960 A1* | 9/2017 | Shiue .................. H01L 21/0254 |
| 2018/0166565 A1* | 6/2018 | Chen .................. H01L 23/3171 |

OTHER PUBLICATIONS

Hilt et al., "Normally-off—High-Voltage p-GaN Gate GaN HFET with Carbon-Doped Buffer," *Proceedings of the 23$^{rd}$ International Symposium on Power Semiconductor Devices & IC's*, May 23-26, 2011, San Diego, California, USA, pp. 239-242.

Joshin, et al., "Outlook for GaN HEMT Technology", *FUJITSU Science Technology Journal*, No. 1, Jan. 2014, pp. 138-143.

Lin, "Market and Technology Trends in WBG Materials for Power Electronics Applications," *CS MANTECH Conference*, May 18-21, 2015, Scottsdale, Arizona, USA, pp. 33-36.

Bai, Z. et al., "Design of high performance normally-off dual junction gate AlGaN/GaN heterostructure field effect transistors for high voltage application," *Journal of Computational Electronics*, vol. 16, Jul. 2017, p. 748-755.

Hilt, O. et al., "Normally-off AlGaN/GaN HFET with p-type GaN Gate and AlGaN Buffer," *Proceedings of the 22nd International Symposium on Power Semiconductor Devised & IC's*, Jun. 6-10, 2010, Hiroshima, Japan, pp. 347-350.

Hilt, O. et al., "Normally-off—High-Voltage p-GaN Gate GaN HFET with Carbon-Doped Buffer," Proceedings of the 23rd International Symposium on Power Semiconductor Devices & IC's, May 23-26, 2011, San Diego, California, USA, pp. 239-242.

Joshin, K. et al., "Outlook for GaN HEMT Technology", *FUJITSU Science Technology Journal*, vol. 50 (No. 1), Jan. 2014, pp. 138-143.

Li, Y. et al., "Positive Shift in Threshold Voltage Induced by CuO and NiOx Gate in AlGaN/GaN HEMTs," *IEEE Transactions on Electron Devices*, vol. 64, No. 8, Aug. 2017, p. 3139-3144.

Lin, H., "Market and Technology Trends in WBG Materials for Power Electronics Applications," *CS MANTECH Conference*, May 18-21, 2015, Scottsdale, Arizona, USA, pp. 33-36.

* cited by examiner

MANUFACTURING METHOD OF AN HEMT TRANSISTOR OF THE NORMALLY OFF TYPE WITH REDUCED RESISTANCE IN THE ON STATE AND HEMT TRANSISTOR

BACKGROUND

Technical Field

The present disclosure relates to a method of invention a high-electron-mobility transistor (HEMT) of a normally off type with reduced ON state resistance, and to a HEMT of a normally off type with reduced ON state resistance.

Description of the Related Art

Known to the art are HEMTs with a heterostructure, in particular of gallium nitride (GaN) and aluminum gallium nitride (AlGaN), at the interface of which a conductive channel may form, in particular a two-dimensional electron gas (2 DEG) channel. For instance, HEMTs are appreciated for their use as high-frequency switches and as power switches, thanks to their high breakdown threshold and to the high electron mobility and density of charge carriers in their conductive channel. In addition, the high current density in the conductive channel of the HEMT affords a low ON state resistance (or simply RON) of the conductive channel.

In HEMTs of a known type, in which a gate electrode extends over the AlGaN/GaN heterostructure, the conductive channel is normally on, in so far as a high density of charge carriers is present even in the absence of a gate voltage applied to the heterostructure.

For reasons of safety and in order to simplify driving circuits of HEMTs, thus favoring use thereof in industrial applications, there have been introduced HEMTs in which the conductive channel is normally off, such as the so-called p-GaN gate transistor.

FIG. 1 is a schematic illustration of a HEMT 1 of a known type in a triad of mutually orthogonal axes x, y, z in lateral sectional view in the plane xz. In particular, the HEMT 1 is a p-GaN gate transistor.

The HEMT 1 includes a semiconductor body 2, which in turn comprises a substrate 4, a buffer layer 6, which extends over the substrate 4, and a heterostructure 7, which extends over the buffer layer 6.

The substrate 4 is made, for example, of silicon, silicon carbide (SiC), sapphire ($Al_2O_3$), or GaN.

The buffer layer 6 is made of gallium aluminum nitride, or else of gallium nitride, of an intrinsic type or with a doping of an N type, or with carbon and/or iron doping.

The heterostructure 7 includes, in particular, a channel layer 10, which extends over the buffer layer 6, and a barrier layer 9, which extends over the channel layer 10. The channel layer 10 is made of gallium nitride (GaN) of an intrinsic type. The barrier layer 9 is made of aluminum gallium nitride (AlGaN).

The HEMT 1 further comprises a source electrode 16 and a drain electrode 18, both of conductive material, such as titanium (Ti), aluminum (Al), tantalum (Ta), or titanium nitride (TiN).

The source electrode 16 and the drain electrode 18 extend at a distance from one another, on the heterostructure 7 and in depth in the heterostructure 7. For instance, the source electrode 16 and the drain electrode 18 may extend in depth along the axis z throughout the thickness of the barrier layer 9 and partially through the channel layer 10.

The HEMT 1 further comprises a doped gate region 12, which extends over the heterostructure 7, between the source electrode 16 and the drain electrode 18 and at a distance therefrom. In particular, the doped gate region 12 is, for example, of gallium nitride with a doping of a P type, for example using magnesium (Mg).

The HEMT 1 further comprises a gate electrode 14, of a conductive material, such as tantalum (Ta), tantalum nitride (TaN), titanium nitride (TiN), palladium (Pa), tungsten (W), tungsten silicide (WSi2), titanium aluminum (Ti/Al), or nickel gold (Ni/Au), which extends over the doped gate region 12. The structure formed by the gate electrode 14 and by the doped gate region 12 is known in the prior art as "p-GaN gate", whence the name "p-GaN gate transistor" for the HEMT 1.

As is known, the doped gate region 12 modifies the band diagram of the heterostructure 7 so that, in the absence of a gate voltage applied to the gate electrode 14, the 2 DEG is depleted in the area underneath the doped gate region 12, i.e., the area of the heterostructure 7 overlying the doped gate region 12 in a top plan view of the HEMT 1. Consequently, in the absence of an applied gate voltage, there is no conductive channel connecting the source electrode 16 and the drain electrode 18.

A known drawback of the HEMT 1, and in general of p-GaN gate transistors, is due to their relatively low threshold voltage. A way for increasing the threshold voltage of the HEMT 1 consists in increasing the concentration of dopant of a P type, for example of magnesium, in the doped gate region 12 and in particular in the proximity of the interface with the barrier layer 9. For instance, the doped gate region 12 has a doping profile such that the concentration of magnesium at the interface between the doped gate region 12 and the barrier layer 9 is comprised between $10^{17}$ cm$^{-3}$ and $5 \times 10^{19}$ cm$^{-3}$, for example $10^{19}$ cm$^{-3}$.

However, increasing the concentration of doping in the doped gate region 12 leads indirectly to an undesired increase in the ON state resistance (RON) of the HEMT device 1. In particular, the increase in the ON state resistance is due to a diffusion of dopant impurities, for example magnesium, from the doped gate region 12 to the regions of the heterostructure 7 that extend, in a top plan view of the HEMT 1, between the gate electrode 14 and, respectively, the source electrode 16 and drain electrode 18. The presence of magnesium in said regions of the heterostructure 7 leads to a partial depletion of the 2 DEG and consequently an undesired increase in the ON state resistance. Consequently, in order to limit the increase in the ON state resistance it is necessary to reduce as much as possible the concentration of magnesium in the heterostructure 7.

In particular, the above diffusion of magnesium from the doped gate region 12 to the heterostructure 7 is a direct consequence of the manufacturing method typically used for the HEMT device 1, in which, following upon formation of the heterostructure 7, the doped gate region 12 is obtained by:

a first step in which an epitaxial layer of magnesium-doped gallium nitride is deposited on the barrier layer 9;

a second step, in which the epitaxial layer is subjected to a thermal annealing to activate the magnesium, carried out at simultaneously with the first step or immediately after the first step; and a third step, carried out following upon the second step, in which the epitaxial layer is chemically etched for selective removal of portions of the epitaxial layer and thus formation of the doped gate region 12.

In particular, the aforementioned second step leads to an undesired diffusion of the magnesium in the heterostructure 7, in particular in the regions between the gate electrode 14 and, respectively, the source electrode 16 and drain electrode 18.

Further, the chemical etching carried out in the third step may lead to an undesired reduction in the thickness of the barrier layer 9, and consequently a further increase in the ON state resistance.

BRIEF SUMMARY

One or more embodiments of the present disclosure provide a transistor of a normally off type with a good compromise between high threshold voltage and reduced ON state resistance so as to overcome at least some of the drawbacks of the prior art.

One or more embodiments of the present disclosure provide a manufacturing method of a HEMT, and a corresponding HEMT that will be able to overcome at least some of the drawbacks of the prior art.

According to the present disclosure a manufacturing method of a HEMT, and a corresponding HEMT are thus provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
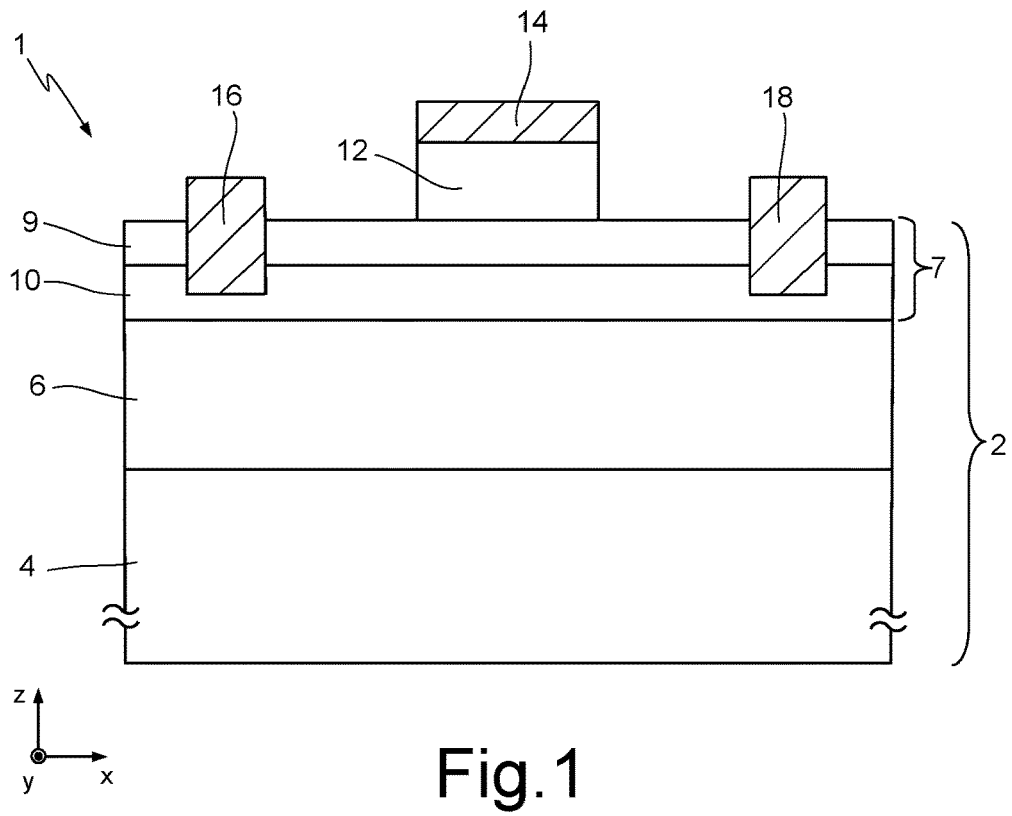
FIG. 1 shows a HEMT in lateral sectional view.
Figure 2:
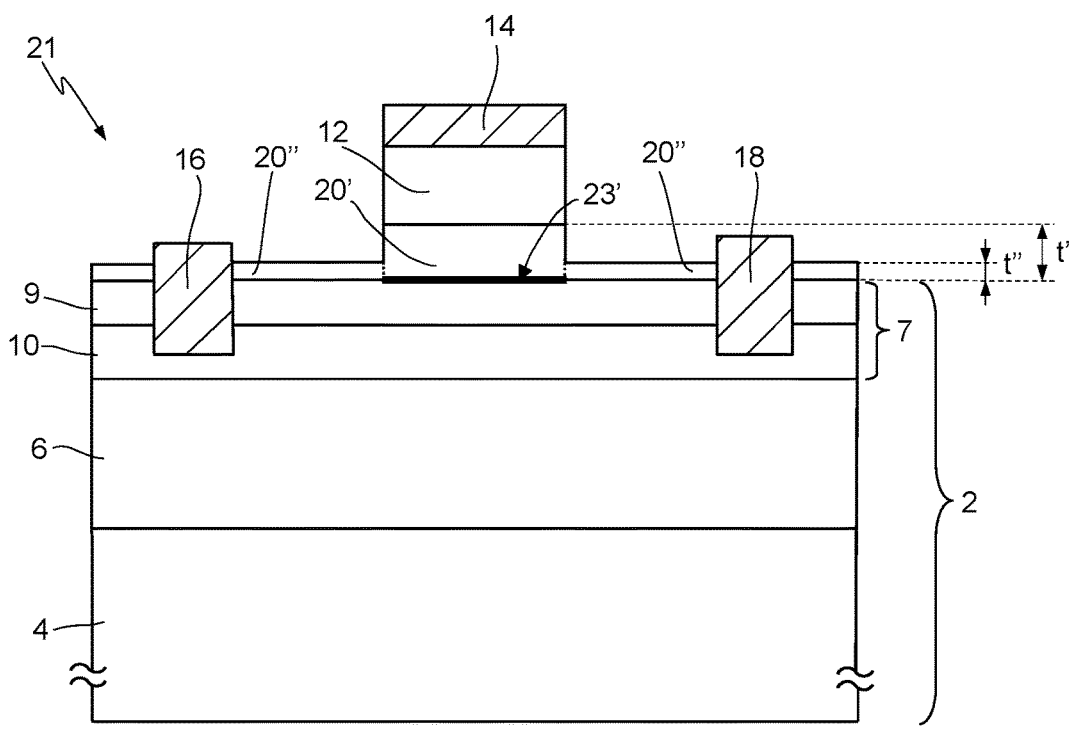
FIG. 2 shows a HEMT according to an embodiment of the present disclosure in lateral sectional view.

FIG. 2 is a schematic illustration of a HEMT 21 according to an embodiment of the present disclosure. In particular, FIG. 2 illustrates the HEMT 21 in a triad of mutually orthogonal axes x, y, z, in lateral sectional view in the plane xz. Elements of the HEMT 21 of FIG. 2 that are in common with the HEMT 1 of FIG. 1 are designated by the same reference numbers.

The HEMT 21 of FIG. 2 differs from the HEMT 1 of FIG. 1 for the presence of a diffusion-control region 20', made, for example, of gallium nitride, which extends on the heterostructure 7.

In particular, the diffusion-control region 20' extends between the doped gate region 12 and the heterostructure 7, and has a thickness t' comprised, for example, between 5 nm and 30 nm, for example 20 nm. In a top plan view of the HEMT 21, the doped gate region 12 and the auxiliary gate region 20' are arranged on top of one another. In particular, the doped gate region 12 extends completely over, and in direct contact with, the auxiliary gate region 20', covering it entirely.

As described in greater detailed hereinafter, in particular in the description of the manufacturing method of the HEMT 21, the thickness t' of the auxiliary gate region 20' is designed so that, in a step of activation of the dopant impurities in the doped gate region 12, a part of said impurities spreads through the auxiliary gate region 20' up to a surface 23' of interface with the barrier layer 9. In particular, the concentration of dopant impurities at the surface of interface 23' is comprised, for example, between $10^{17}$ cm$^{-3}$ and $10^{19}$ cm$^{-3}$, for example $2\times10^{18}$ cm$^{-3}$. Consequently, the diffusion-control region 20' is further a region with a high concentration of dopant impurities of a P type, as the doped gate region 12. In addition, the high concentration of magnesium at the interface between the barrier layer 9 and the diffusion-control region 20' entails a desired increase of the threshold voltage of the HEMT 21, as has been described for the HEMT 1.

The HEMT 21 may further comprise a protection region 20", made, for example, of intrinsic gallium nitride, which extends over the heterostructure 7, and in particular in contact with the regions of the heterostructure 7 that in a top plan view in the plane xy are not arranged on top of the doped gate region 12. In other words, the protection region 20" entirely covers the regions of the heterostructure 7 not covered by the diffusion-control region 20'.

The protection region 20" has a thickness t" sufficient to protect the heterostructure 7. For instance, the thickness t" of the protection region 20" is comprised between 1 nm and 5 nm, for example, 2 nm. Preferably, the protection region 20" has a thickness t" smaller than the thickness t' of the diffusion-control region 20', and consequently is not in contact with the doped gate region 12.

In the HEMT 21, the source electrode 16 and drain electrode 18 extend over the protection region 20" and in depth along the axis z throughout the thickness of the protection region 20" and of the barrier layer 9, and partially through the channel layer 10.

According to an aspect of the present disclosure, the concentration of magnesium is negligible in the regions of the heterostructure 7 underneath the protection region 20" (i.e., between the gate and drain, and the gate and source), and consequently there is no undesired increase of the ON state resistance. In particular, the concentration of magnesium in regions of the heterostructure 7 at a distance larger than 20 nm from the surface of interface 23' is for example less than $10^{17}$ cm$^{-3}$.

The buffer layer 6 has a thickness, for example, comprised between 1 μm and 8 μm, for example, 5 μm.

The channel layer 10 has a thickness, for example, comprised between 100 nm and 1 μm, for example, 300 nm.

The barrier layer 9 has a thickness, for example, comprised between 5 nm and 30 nm, for example, 15 nm.

The doped gate region 12 has a thickness, for example, comprised between 10 nm and 200 nm, for example, 50 nm.

Illustrated in what follows, with reference to FIGS. 3A-3F, are steps of a manufacturing method of the HEMT device 21 of FIG. 2.

Figure 3A:
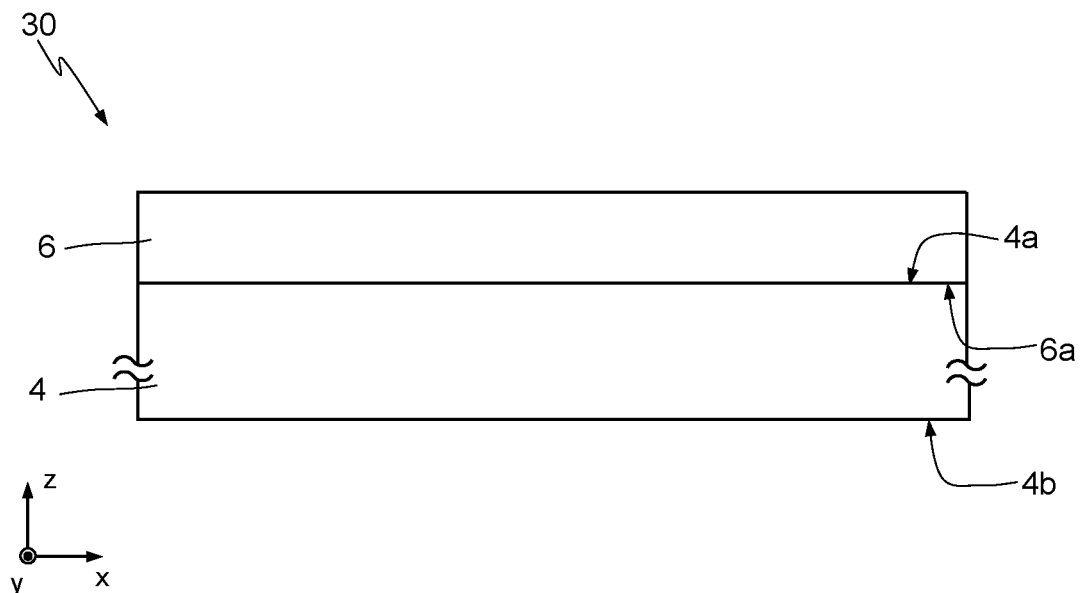
FIGS. 3A-3F show steps of a manufacturing method of the HEMT of FIG. 2.
Figure 3B:
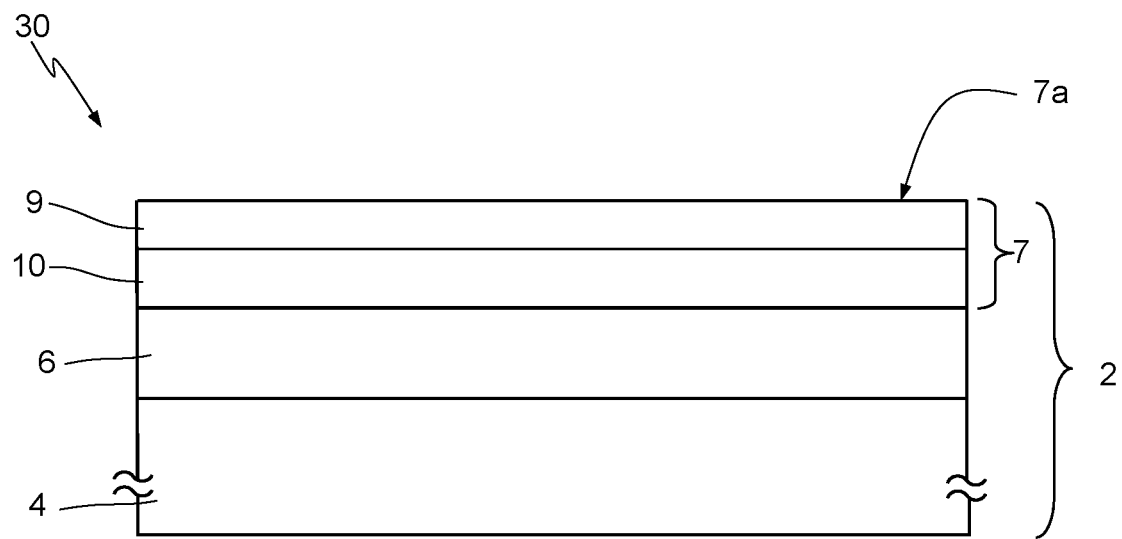
Figure 3C:
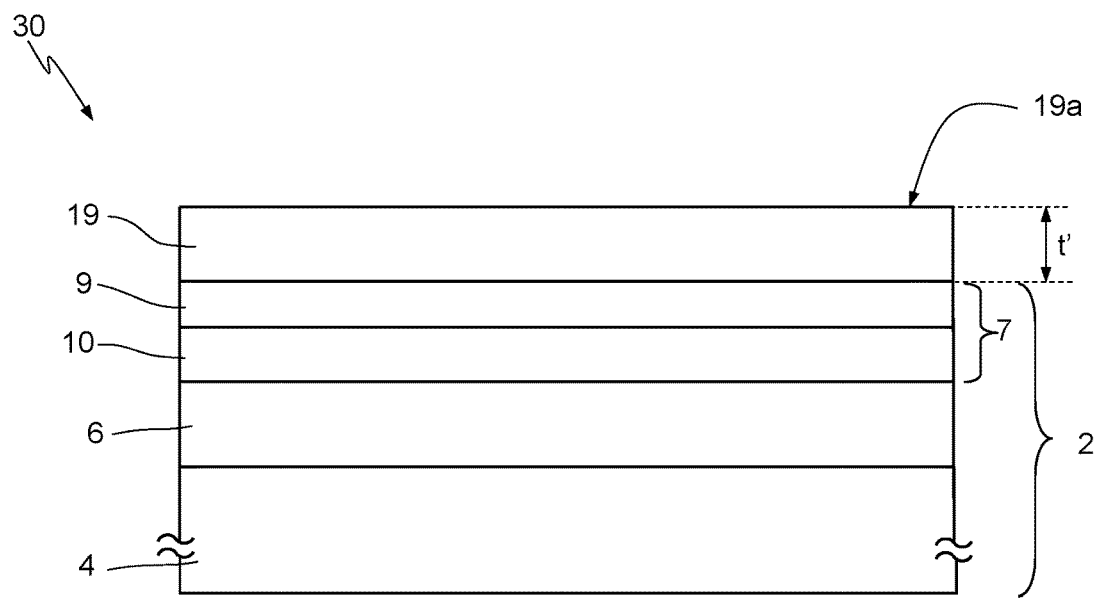
Figure 3D:
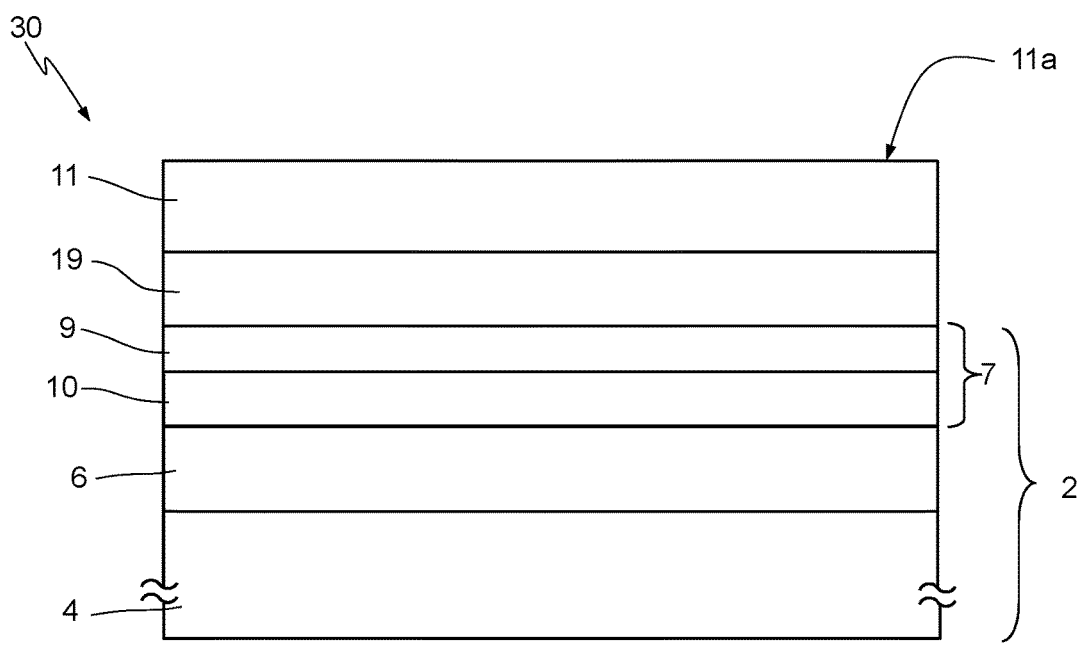
Figure 3E:
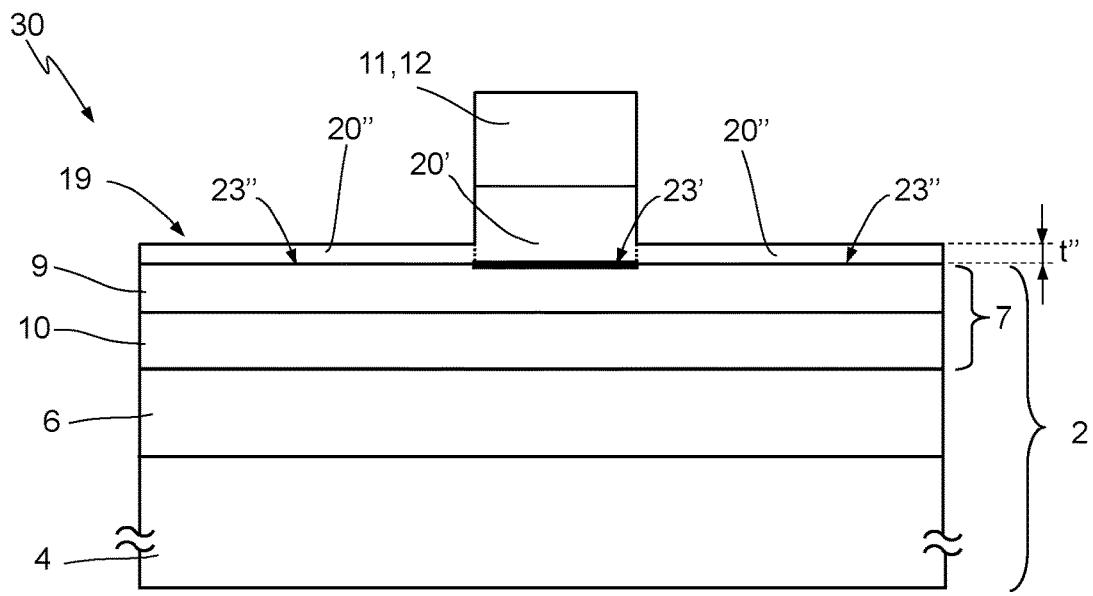
Figure 3F:
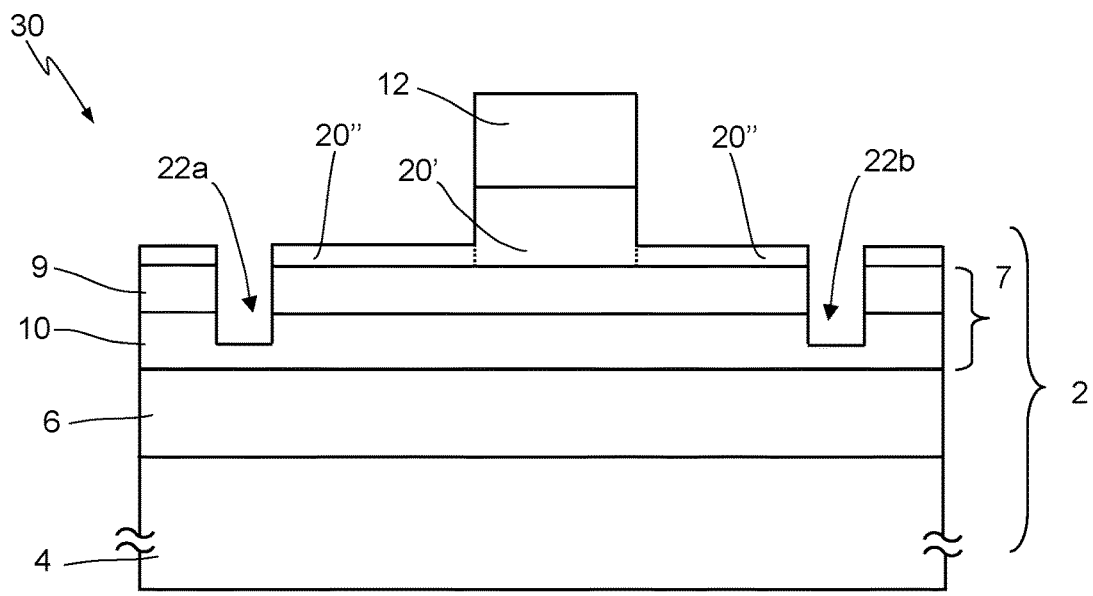

FIG. 3A shows, in lateral sectional view, a portion of a wafer 30 during a step of manufacture of the HEMT device 21, according to an embodiment of the present disclosure. Elements of the wafer 30 that are common to what has already been described with reference to FIG. 2, and illustrated in said FIG. 2, are designated by the same reference numbers.

In particular (FIG. 3A), the wafer 30 comprising the substrate 4 is made, for instance, of silicon (Si), silicon carbide (SiC), aluminum oxide ($Al_2O_3$), or gallium nitride (GaN), and has a front side 4a and a back side 4b opposite to one another in the direction z. The wafer 30 further comprises the buffer layer 6, which is made of aluminum gallium nitride (AlGaN), gallium nitride (GaN) whether intrinsic or with a doping of an N type, and has its own underside 6a that extends on the front side 4a of the substrate 4 (with the possible intermediate presence of further interface layers, not illustrated in the figures).

This is followed (FIG. 3B) by formation of the heterostructure 7. In a first step the channel layer 10, of intrinsic gallium nitride (GaN), is formed, for example via epitaxial growth. The channel layer 10 has a thickness, for example, comprised between 100 nm and 1 µm, for example 300 nm. Next, the barrier layer 9 of aluminum and gallium nitride (AlGaN) is formed, for example via epitaxial growth. The barrier layer 9 has a thickness comprised between 5 nm and 30 nm, for example, 15 nm. The top side, which is exposed, of the barrier layer 9 forms a front side 7a of the heterostructure 7.

This is followed (FIG. 3C) by formation, on the front side 7a of the heterostructure 7, of a first epitaxial layer 19, for instance, of intrinsic gallium nitride, which in subsequent steps of the manufacturing method forms the auxiliary gate region 20' and the protection region 20". The first epitaxial layer 19 has a thickness equal to the thickness t' of the auxiliary gate region 20' of the HEMT 21 of FIG. 2. The top side, which is exposed, of the first epitaxial layer 19 forms a front side 19a of the first epitaxial layer 19.

Next (FIG. 3D), formed on the front side 19a of the first epitaxial layer 19, is a second epitaxial layer 11, for example of gallium nitride with a doping of a P type, for example using magnesium, which in subsequent steps of the manufacturing method forms the doped gate region 12. The second epitaxial layer 11 has a thickness comprised, for example, between 10 nm and 200 nm, for example, 50 nm. The top side, which is exposed, of the second epitaxial layer 11 forms a front side 11a of the second epitaxial layer 11.

According to one aspect of the present disclosure, the second epitaxial layer 11 is formed, for example, via metalorganic chemical vapor deposition (MOCVD), in which the gallium nitride is grown directly with a concentration of magnesium doping comprised between $10^{18}$ cm$^{-3}$ and $5\times10^{19}$ cm$^{-3}$, for example, $2\times10^{19}$ cm$^{-3}$. In particular, this step is carried out in an MOCVD reactor in an environment that has a magnesium precursor and at a temperature comprised, for example, between 900° C. and 1200° C., for example, 1050° C. Furthermore, this step is carried out so as to hinder diffusion of magnesium dopant impurities from the second epitaxial layer 11 to other portions of the wafer 30. Consequently, at the end of the step of FIG. 3D, the magnesium dopant impurities in the second epitaxial layer 11 are not yet activated, and have diffused only partially in other portions of the wafer 30. In particular, the concentration of magnesium in the first epitaxial layer 19 is negligible in the proximity of the barrier layer 9. In particular, the concentration of magnesium is less than $10^{17}$ cm$^{-3}$ at the interface between the first epitaxial layer 19 and the barrier layer 9 and throughout the thickness of the barrier layer 9. In addition, the concentration of magnesium is less than $10^{16}$ cm$^{-3}$ throughout the thickness of the channel layer 10.

This is followed (FIG. 3E) by selective etching of the first and second epitaxial layers 11, 19, using a first lithographic mask configured to protect from etching selective portions thereof. In particular, the selective portions of the first and second epitaxial layers 11, 19 protected by the first lithographic mask extend in regions of the wafer 30 in which the gate electrode 14, the doped region 12, and the auxiliary gate region 20' are to be provided.

In particular, the selective etching proceeds up to complete removal of the portions of the first epitaxial layer 11 not protected by the first lithographic mask. In addition, the selective etching proceeds until the thickness of the second epitaxial layer 19 is reduced, in portions thereof not protected by the first lithographic mask, to a value equal to the thickness t" of the protection region 20" of the HEMT 21 of FIG. 2. The protection region 20" is thus formed.

Once selective etching of the first and second epitaxial layers 11, 19 is terminated, a step of thermal annealing of the wafer 30 is carried out in order to activate the magnesium dopant impurities present in the first epitaxial layer 11.

Further, during annealing, the dopant impurities diffuse in depth from the first epitaxial layer 11 to the second epitaxial layer 19 until a first surface 23' is reached, arranged at the interface between the barrier layer 9 and the second epitaxial layer 19, and entirely on top of the first epitaxial layer 11 in a top plan view of the wafer 30. In particular, during thermal annealing the first surface 23' coincides with the first epitaxial layer 11 in respective orthogonal projections in the plane xy. The doped gate region 12 and the auxiliary gate region 20' are thus formed.

According to an aspect of the present disclosure, the concentration of dopant impurities with which the first epitaxial layer 11 is grown, the thickness t' of the second epitaxial layer 19, and the process parameters of annealing are designed so that, at the end of annealing, the concentration of magnesium at the first surface 23' is comprised, for example, between $10^{18}$ cm$^{-3}$ and $10^{19}$ cm$^{-3}$, for example, $5\times10^{18}$ cm$^{-3}$.

In particular, thermal annealing may comprise a step of rapid thermal annealing (RTA), in which the wafer 30 is subject to the following temperature profile: (i) heating from room temperature to a high temperature, for example comprised between 700° C. and 1000° C., for example, 800° C., during a first time interval comprised, for example, between 1 s and 10 s, for example, 5 s; (ii) permanence at said high temperature for a second time interval comprised, for example, between 10 s and 5 min, for example, 2 min; (iii) cooling from said high temperature to room temperature, during a third time interval comprised, for example, between 1 s and 10 s, for example 5 s.

Thermal annealing leaves the concentration of magnesium in the portions of the second epitaxial layer 19 that form the protection region 20" substantially unvaried, thanks to the prior removal of the portions of the epitaxial layer 11 on said portions of the second epitaxial layer 19. The concentration of magnesium is thus less than 1017 cm-3 on a second surface 23" at the interface between the protection region 20" and the barrier layer 9, and throughout the thickness of the barrier layer 9 underneath the second surface 23". Further, the concentration of magnesium is less than $10^{16}$ cm$^{-3}$ throughout the thickness of the channel layer 10 underneath the second surface 23".

There then follows (FIG. 3F) etching of selective portions of the protection region 20" and of the heterostructure 7 using a second lithographic mask, which leaves exposed and thus subject to etching the areas of the wafer 30 in which the source and drain electrodes 16, 18 of the HEMT 21 of FIG. 2 are to be formed. In particular, a first opening 22a and a second opening 22b are formed on opposite sides, along the axis x, of the doped gate region 12, and at a distance from the doped gate region 12. Each of the first and second openings 22a, 22b extends in depth through the protection region 20" and the heterostructure 7, terminating within the channel layer 10.

Then, a step of formation of ohmic contacts is carried out to provide the source electrode 16 and the drain electrode 18, depositing conductive material, in particular metal, such as titanium (Ti) or aluminum (Al), or alloys or compounds thereof, using a sputter or evaporator and a lift-off photolithographic mask, inside the openings 22a, 22b. The conductive material fills the openings 22a, 22b completely, to form the source electrode 16 and the drain electrode 18, respectively. Consequently, the portions of the heterostructure 7 that extend, in a top plan view of the wafer 30, between the doped gate region 12 and, respectively, the source electrode 16 and drain electrode 18 have a negligible concentration of magnesium. Following upon deposition, a step of rapid thermal annealing is carried out, for example at a temperature of approximately between 500° C. and 900° C. for a time comprised between 30 s and 2 min.

Then, a step of deposition of conductive material on the wafer 30 is carried out to form the gate electrode 14 on the doped gate region 12. For instance, the gate electrode is made of metal material, such as tantalum (Ta), tantalum nitride (TaN), titanium nitride (TiN), palladium (Pa), tungsten (W), tungsten silicide ($WSi_2$), titanium aluminum (Ti/Al), or nickel gold (Ni/Au).

The HEMT 21 of FIG. 2 is thus formed.

In another embodiment (not illustrated in the figures), the protection region 20" is absent. In this case, the step of chemical etching of the second epitaxial layer 19 is carried out up to entire removal of the portions of the second epitaxial layer 19 not protected by the first lithographic mask. In this case, the heterostructure 7 is not protected from the external environment.

In another embodiment (not illustrated in the figures), the protection region 20" has the same thickness as the auxiliary gate region 20'. In this case, the respective manufacturing method does not comprise a step of etching of the second epitaxial layer 19. However, a large thickness of the protection region 20" could affect in an undesirable way the properties of the 2 DEG. For instance, it could partially deplete the 2 DEG underneath the protection region 20" and thus increase the ON state resistance of the HEMT.

From an examination of the characteristics of the disclosure described and illustrated herein the advantages that it affords are evident.

For instance, the HEMT according to the present disclosure achieves a good compromise between high threshold voltage and low ON state resistance. This is due to the fact that, unlike p-GaN gate transistors of a known type, the thermal annealing to activate dopant impurities in an epitaxial layer with a high concentration of dopant impurities (i.e., the first epitaxial layer 11 in the present disclosure) is carried out following upon a step of selective removal of portions of said epitaxial layer, and in particular of the portions external to a gate region of the HEMT. Consequently, the dopant impurities may diffuse only towards regions of the heterostructure underlying the gate region in order to increase the threshold voltage, whereas it may not diffuse in the regions of the heterostructure that connect the gate region to the source and drain regions, thus preventing an increase in the ON state resistance.

Finally, it is clear that modifications and variations may be made to the disclosure described and illustrated herein, without thereby departing from the scope of the present disclosure.

For instance, the source electrode 16 and the drain electrode 18 may extend at different depth in the heterostructure 7 or may be formed on top of the heterostructure 7, in direct contact therewith.

Furthermore, the doped gate region 12 and the auxiliary gate region 20' may be made of some other material, such as aluminum and gallium nitride with a doping of a P type, respectively.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT), comprising:
   a semiconductor heterostructure;
   a first doped gate region, which extends over the heterostructure and contains dopant impurities of a P type; and
   a second doped gate region having a first side in contact with the first doped gate region and a second side in contact with the heterostructure, the second side opposite to the first side, the second doped gate region vertically between the first doped gate region and the heterostructure, the second doped gate region containing dopant impurities of the P type, a doping concentration of the dopant impurities in the second doped gate region being not greater than a doping concentration of the dopant impurities in the first doped gate region,
   wherein the heterostructure includes:
      a first portion that extends at the second side of the second doped gate region and has a first concentration of dopant impurities of the P type; and
      a second portion that extends laterally of the first portion and has a second concentration of dopant impurities of the P type lower than the first concentration.

2. The HEMT according to claim 1 wherein:
   the first doped gate region has a concentration of dopant impurities of the P type comprised between $10^{18}$ $cm^{-3}$ and $5 \times 10^{19}$ $cm^{-3}$;
   the second side of the second doped gate region has a concentration of dopant impurities of the P type comprised between $10^{18}$ $cm^{-3}$ and $10^{19}$ $cm^{-3}$; and
   the second portion of the heterostructure has a concentration of dopant impurities of the P type of less than $10^{17}$ $cm^{-3}$ at a lateral distance of 20 nm from the second doped gate region.

3. The HEMT according to claim 1 wherein the second doped gate region has a thickness comprised between 2 nm and 30 nm.

4. The HEMT according to claim 1, further comprising a protection region, which extends on the second portion of the heterostructure and alongside the second doped gate region, in contact with the second portion of the heterostructure and with the second doped gate region; the protection region having a thickness comprised between 1 nm and 5 nm.

5. The HEMT according to claim 1, further comprising source and drain electrodes in electrical contact with the heterostructure, which extend alongside, and at a distance from, the first doped gate region and the second doped gate region.

6. The HEMT according to claim 1 wherein the heterostructure comprises:
   a channel layer; and
   a barrier layer which extends on the channel layer, wherein the channel layer and the barrier layer are of respective compound materials that include elements of groups III-V.

7. The HEMT according to claim 6 wherein the channel layer is made of intrinsic gallium nitride and has a thickness comprised between 100 nm and 1 µm, and the barrier layer is made of aluminum gallium nitride and has a thickness comprised between 5 nm and 30 nm.

8. The HEMT according to claim 1 wherein a first epitaxial layer is made of intrinsic gallium nitride, and the second epitaxial layer is made of gallium nitride containing magnesium dopant impurities.

9. A device, comprising:
a substrate;
a heterostructure on the substrate, the heterostructure including:
a channel layer on the substrate;
a barrier layer on the channel layer;
a diffusion control layer on the barrier layer, the diffusion control layer includes a first surface;
a first electrode having a first surface in the channel layer that is spaced from a second surface, the first surface of the diffusion control layer being closer to the barrier layer than the second surface of the first electrode; and
a gate that includes:
an auxiliary gate region on the barrier layer, the auxiliary gate region extending from the barrier layer through the diffusion control layer; and
a doped gate region on the auxiliary gate region, a first gate region including a doping concentration of P type impurities that is higher than a doping concentration of P type impurities in the auxiliary gate region, the auxiliary gate region vertically between the doped gate region and the heterostructure,
wherein the barrier layer includes a first doping concentration of a dopant in a first portion below the auxiliary gate region and a second doping concentration of the dopant in a second portion below the diffusion control layer.

10. The device of claim 9 wherein the gate includes a gate electrode on the doped gate region.

11. The device of claim 10 wherein the diffusion control layer has a first dimension between the barrier layer and the first surface of the diffusion control layer and the auxiliary gate region has a second dimension from the barrier layer to a first surface of the auxiliary gate region.

12. The device of claim 11 wherein the first dimension is less than the second dimension.

13. The device of claim 11 wherein the first surface of the auxiliary gate region is further from the barrier layer than the first surface of the diffusion controller layer.

14. A device, comprising:
a substrate;
a channel layer on the substrate;
a barrier layer on the channel layer;
a diffusion control layer on the barrier layer, the diffusion control layer includes a first surface;
an electrode that extends from the channel layer, through the barrier layer, and through the diffusion control layer, the electrode including a second surface that is further from the barrier layer than the first surface of the diffusion control layer; and
a gate that includes:
an auxiliary gate region on the barrier layer, the auxiliary gate region extending from the barrier layer through the diffusion control layer; and
a doped gate region on the auxiliary gate region, the doped gate region including a doping concentration of P type impurities that is higher than a doping concentration of P type impurities in the auxiliary gate region, the auxiliary gate region vertically between the doped gate region and the barrier layer,
wherein the barrier layer includes a first doping concentration of a dopant in a first portion below the auxiliary gate region and a second doping concentration of the dopant in a second portion below the diffusion control layer.

15. The device of claim 14 wherein the auxiliary gate region is in direct contact with the barrier layer.

16. The device of claim 14 wherein an interface between the doped gate region and the auxiliary gate region is further from the barrier layer than the first surface of the diffusion control layer.

17. The device of claim 14 wherein an interface between the doped gate region and the auxiliary gate region is further from the barrier layer than the second surface of the electrode.

18. The device of claim 14, wherein the gate includes a gate electrode on the doped gate region.

* * * * *